(12) United States Patent
Chen et al.

(10) Patent No.: US 6,462,163 B2
(45) Date of Patent: Oct. 8, 2002

(54) SOLVENTLESS LAMINATING ADHESIVE WITH BARRIER PROPERTIES

(75) Inventors: Mai Chen, Hoffman Estates, IL (US); Jeffrey H. Deitch, Crystal Lake, IL (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/808,653

(22) Filed: Mar. 14, 2001

(65) Prior Publication Data

US 2001/0012868 A1 Aug. 9, 2001

Related U.S. Application Data

(62) Division of application No. 08/932,126, filed on Sep. 17, 1997, now abandoned.

(51) Int. Cl.$^7$ ................................................ C08G 18/42
(52) U.S. Cl. ......................... 528/83; 528/905; 525/440
(58) Field of Search .................... 528/83, 905; 525/440

(56) References Cited

U.S. PATENT DOCUMENTS

| | | | |
|---|---|---|---|
| 2,801,648 A | * | 8/1957 | Anderson et al. |
| 3,874,989 A | | 4/1975 | Stange et al. ................ 161/190 |
| 4,010,311 A | * | 3/1977 | Lewis et al. |
| 4,242,488 A | | 12/1980 | Stanley et al. ........... 428/423.1 |
| 4,797,463 A | | 1/1989 | Grimm et al. ................. 528/60 |
| 5,872,203 A | | 2/1999 | Wen et al. ..................... 528/66 |

FOREIGN PATENT DOCUMENTS

| | | |
|---|---|---|
| EP | 1374574 | 8/1964 |
| EP | 160881 | 6/1984 |
| EP | 488 617 | 3/1992 |

OTHER PUBLICATIONS

"Recent Advances in Polymers for Barrier Applications", Trends in Polymer Science, Mar. 1997, vol. 5, No. 3, pp. 75–79.

* cited by examiner

Primary Examiner—Rachel Gorr
(74) Attorney, Agent, or Firm—Stephen T. Falk, Esq.

(57) ABSTRACT

A solventless urethane adhesive layer which proves excellent oxygen and moisture barrier properties is formed from the reactio of A) a low molecular weight polyester formed from a single species of linear aliphatic diol and a single species of dicarboxylic acid with B) a single species of diisocyanate.

6 Claims, No Drawings

SOLVENTLESS LAMINATING ADHESIVE WITH BARRIER PROPERTIES

CROSS REFERENCE TO RELATED PATENT APPLICATIONS

This application is a divisional application of Ser. No. 08/932,126, filed Sep. 17, 1997, now abandoned.

The present invention is directed to laminating adhesives useful for joining polymeric films, particularly in providing polymeric film laminates for food products, drug products, and the like. The laminating adhesive is "solventless", meaning it is both water-free and organic solvent-free. The adhesive provides excellent oxygen and moisture barrier properties.

BACKGROUND OF THE INVENTION

Oxygen, moisture, and other gases tend to degrade many food and drug products. Many polymeric films useful in food packaging, drug packaging, or the like are relatively permeable to both oxygen and moisture. To enhance barrier properties, polymeric films may be bonded together to form laminates using adhesive layers having high barrier properties.

Currently, barrier laminating adhesives are chiefly waterborne or solvent-borne polyvinylidine chloride (PVDC) formulations. If the solution is water-borne, energy needs to be expended to evaporate the water. Organic solvent-based formulations also involve some energy expenditure in removing the solvent, and solvents represent a workplace and environmental detriment. Packagers who have only solventless laminating machines must use films that are pre-coated with PVDC. Also, the chlorine in PVDC represents an environmental contaminant.

Another high barrier material is ethylene vinyl alcohol (EVOH), typically applied as a water-based adhesive formulation. While EVOH has no chlorine, the water in the formulation represents an energy expenditure. EVOH has a high melting temperature, i.e., greater than 150° C. At such high melting temperature, most polymeric films would also melt; thus EVOH cannot be applied as a solventless adhesive. While EVOH has excellent barrier properties with respect to oxygen and other gases, it has poor moisture barrier properties. Also, EVOH is relatively expensive.

The present invention is directed to solventless urethane adhesives useful for laminating and which provide high barrier properties, both with respect to oxygen and with respect to moisture. Most commercial urethane solventless adhesives have very poor oxygen barrier properties because such urethane adhesives tend to be amorphous polymers.

SUMMARY OF THE INVENTION

Solventless urethane adhesives in accordance with the invention comprise the reaction product of A) a hydroxyl terminated polyester formed from a single linear aliphatic diol having between 2 and 10 carbon atoms, preferably between 3 and 6 carbon atoms, and a single linear dicarboxylic acid with B) a single species of liquid diisocyanate at an NCO/OH ratio of between about 1 and about 1.1. The polyester A) is in crystalline form at ambient temperature and has a melting point of about 80° C. or below, preferably about 70° C. or below, more preferably about 60° C. or below, and most preferably about 55° C. or below. The number average ($M_n$) molecular weight of the polyester is between about 300 and about 5000, preferably between about 500 and about 2000. Because the resulting urethanes are formed from a single linear diol, a single linear dicarboxylic acid and, a single diisocyanate species, the polyurethanes have high crystallinity with attendant high oxygen and high moisture barrier properties. The low melting points of the polyesters allows the adhesives to be applied at low temperatures without any solvent, where by the polymer films being laminated are not degraded and not deformed.

It is within the scope of the invention, and is in some cases preferred, that a portion A') of the polyester A) be reacted with all of or a portion B') of the isocyanate B) at an NCO/OH ratio of between about 2 and about 8 to form a urethane prepolymer C), and the remaining portion A") of the polyester A) subsequently admixed with the prepolymer C) and any remaining portion B") of the isocyanate B) to form an adhesive mixture suitable for laminating the adhesives. In such case, the NCO/OH ratio of B), including in such case B') and B"), to A), including both A') and A"), is, nevertheless, between about 1 and about 1.1.

DETAILED DESCRIPTION OF CERTAIN PREFERRED EMBODIMENTS

Preferred linear aliphatic diols for forming the polyester chains are $C_3$–$C_6$ diols, n-butanediol and n-hexanediol being the preferred diols, both from the standpoint of forming an adhesive with good barrier properties and from an availability and economic standpoint.

Adipic acid is the preferred dicarboxylic acid for forming the polyesters of the present invention, although other suitable dicarboxylic acids may be used, including, but not limited to azelaic acid and sebacic acid.

Currently, the most preferred polyesters are the reaction products of either 1,6-hexanediol or 1,4-butanediol with adipic acid.

Diol is reacted with dicarboxylic acid so as to form hydroxyl-terminated polyesters having OH numbers between about 20 and about 350, preferably between about 100 and about 250.

Preferred diisocyanates are aliphatic diisocyanates, particularly linear diisocyanates, including polymeric hexamethylene diisocyante (HDI).

However, other diisocyanates, including methylene diphenyl diisocyante (MDI), dicyclohexylllmlelthane 4,4'-diisocyanate ($H_{12}$MDI) and toluene diisocyanate (TDI) may also be used. The diisocyanate generally comprise a smaller portion of the linear polyurethane chain than does the polyester; thus the choice of diisocyanate is generally less critical than the nature of the polyester. From the standpoint of forming a very high barrier, polymeric HDI is currently preferred. However, polymeric HDI is a relatively expensive material, and less expensive diisocyanates, such as MDI, may be used where the barrier property demands are less stringent.

The diisocyanates useful in the invention are liquids at ambient temperatures, i.e., 20–25° C. The low molecular weight polyesters of the invention are highly crystalline, but melt at relatively low temperatures due to their low molecular weights. It is necessary that the polyesters melt at a low temperature only somewhat above ambient temperatures so that the adhesives may be applied at a temperature only somewhat above ambient temperatures, whereat the polymer films forming the laminate are not degraded or deformed. This, of course, depends upon the particular nature of the polymeric film(s), but generally it is desired that the polyester melt below about 80° C. and even lower for the more heat-sensitive films.

For application using high speed laminating machines, e.g., 600 ft/min (183 m/min) or higher, it is preferred that the viscosity of the urethane/polyester mixture range from about 300 to about 2000 cps at the laminating temperature, preferably between about 400 to about 1000 cps at the laminating temperature. Preferably, the laminating temperature is 80° C. or below, more preferably 70° C. or below, even more preferably 60° C. or below, and most preferably 55° C. or below. Accordingly, for reference purposes, depending upon the particular application, the above-described viscosities should apply at least one of the above-listed temperatures, i.e., 80°, 70°, 60°, or 55°C.

The adhesives of the present invention are useful for adhering a wide variety of polymer film types, including polypropylenes, polyethylenes, polyesters, polyamide, and coextruded films. Of course, the adhesives are most useful in adhering films having poor barrier properties to provide high barrier laminates. Adhesion between two films is very good, and laminates formed from the urethane adhesives are inseparable.

Generally, the two adhesive components are mixed just prior to lamination, i.e., within about 1 min. of lamination or less, molten polyester being mixed with liquid diisocyanate to form an adhesive mixture composition. The adhesive mixture composition is applied to one of the polymer films and the films nipped together and the resulting laminate rolled into a reel. Coating weights typically range from 1 to 3 pounds per ream (1.6–4.9 g/m$^2$), preferably around 1.5 pounds per ream (2.4 g/m$^2$). A slow urethane-forming reaction is most desirable for achieving high barrier properties, and after lamination, the laminate is rolled and the reel stored at ambient temperature for a period sufficient to effect complete reaction between the isocyanate and the hydroxyl groups of the polyester; typically, at least a week storage at ambient temperature is desired.

It is further within the scope of the present invention to pre-react the diisocyanate with a portion of the polyester so as to form low viscosity isocyanate-capped prepolymers and reacting the remainder of the polyester with the prepolymer, and an NCO/OH ratio of between about 1 and about 1.1 at point at application. In either case, single species of diol, dicarboxylic acid and, preferably, diisocyanate are used to provide an adhesive layer of high crystallinity and, therefore, high barrier properties with respect to oxygen, moisture and other gases. If a prepolymer is formed, an NCO/OH ratio of between about 2 to about 8 is generally used in forming the prepolymer. The main reason for forming a prepolymer in which a portion of the polyester is pre-reacted with the diisocyanate is to ensure that the viscosity of the adhesive mixture composition is not too low at the application temperature. Generally, if this method is followed, all of the diisocyanate will be reacted with an appropriate portion of the polyester. However, if even 25 wt % of the diisocyanate is pre-reacted with an appropriate portion of the polyester, a significant adjustment in viscosity may be seen. Preferably, at least 50 wt % of the polyester is pre-reacted, if urethane prepolymer is desired for viscosity adjustment.

An NCO/OH ratio of 1 is theoretically desired in reacting the polyester with the isocyanate, whether the polyester is reacted with a diisocyante or whether a urethane prepolymer is reacted with a polyester. However, as the polyester may contain some residual water from the polyester condensation reaction, a slight excess of diisocyante is typically used, up to an NCO/OH ratio of about 1.1.

The invention will now be described in greater detail by way of specific examples.

EXAMPLES 1–5

Example 1

13 parts by weight (pbw) of a polyester of 1,4, butanediol adipate (OH#225) is admixed with 10 parts by weight of polymeric HDI. The mixture is coated onto a 1 mil (25 micron), clear oriented polypropylene (OPP) film at 1.6 pounds per ream (2.6 g/m$^2$) coating weight. Another 1 mil OPP film was laminated to the coated film at a nip temperature of 160° F. (71° C.).

Example 2

26.4 pbw of 1,6-hexanediol adipate (OH#112) was mixed with 10 pbw HDI polyisocyanate. The adhesive was coated onto a 1 mil low density polyethylene (LDPE) film at 2 lb/rm coating weight. Another 1 mil LDPE film was coated onto the coated film at a nip temperature of 160° F. (71° C.).

Example 3

40 pbw of 1,6-hexanediol adipate (OH#112) was mixed with 10 pbw of 2,4'-4,4-methylene diphenyl diisocyanate (MDI). The mixture was used to laminate two, 1 mil coextruded (COEX) films at a nip temperature of 160° F.

Comparative Example 4

40 pbw of diethyleneglycol adipate (OH#112) was mixed with 10 pbw 2,4'-4,4'-MDI and used to form a laminate as per example 3.

Comparative Example 5

A conventional amorphous urethane adhesive was used to laminate two 1 mil LDPE adhesives as per example 2.

For reference, 1 mil layer of the films used in the examples without the adhesive layer have oxygen transmission rates (OTRs) in cc/in$^2$/day at 0% humidity, 75° F.: LDPE—479.0; OPP—98.0; and COEX—85.6.

Results are as follows (OTR in cc/in$^2$/day at 0% humidity 75° F.):

| Example 1 | Example 2 | Example 3 | Comp. Ex. 4 | Comp. Ex. 5 |
|---|---|---|---|---|
| OPP/OPP | LDPE/LDPE | COEX/COEX | COEX/COEX | LDPE/LDPE |
| 2.3 | 5.3 | 4.0 | 42.2 | 144.5 |

The moisture vapor transmission rate of example 1 was 0.13 cc/100 in$^2$/day compared with a 1 mil layer of OPP with a moisture vapor transmission of 0.40 cc/100 in$^2$/day.

What is claimed is:

1. A urethane laminating adhesive composition for forming a high barrier adhesive, the composition comprising a solventless liquid mixture of:

either (I)
 (a) a hydroxyl-terminated polyester A), in molten form, said polyester A) formed from a single species of a linear aliphatic diol having from 2 to 10 carbons and a single species of a linear dicarboxylic acid, said polyester A) having a number average molecular weight from about 300 to about 5000 and a melting point of 80° C. or below, and
 (b) a single species of diisocyanate B);

or (II)
 (x) a urethane prepolymer C) which is the reaction product of all of or a portion B') of said diisocyanate B) with a portion A') of said polyester A) at an NCO/OH ratio of between about 2 and about 8,
 (y) the remaining portion A") of polyester A), and
 (z) any remaining portion B") of diisocyanate B), in either case (I) or (II), the NCO/OH ratio of said diisocyanate B) to said polyester A) being between about 1 and about 1.1; and wherein the polyester A) is reacted with diisocyanate B) just prior to or upon application to a substrate, or the prepolymer C is formed and reacted with the remaining diisocyanate B") and polyester A") just prior to or upon application to a substrate, under conditions such that polyester crystalline domains form in the composition before substantial curing occurs.

2. The adhesive composition according to claim 1 wherein said diol has between 3 and 6 carbons.

3. The adhesive composition according to claim 1 wherein said polyester has a number average molecular weight between about 500 and about 2000.

4. The adhesive composition according to claim 1 wherein said polyester has a melting point of about 70° C. or below.

5. The adhesive composition according to claim 1 wherein said polyester has a melting point of about 60° C. or below.

6. The adhesive composition according to claim 1 wherein said polyester has a melting point of about 55° C. or below.

* * * * *